United States Patent [19]

Walsh

[11] Patent Number: 4,496,250

[45] Date of Patent: Jan. 29, 1985

[54] THERMOCOUPLE OPEN CIRCUIT DETECTOR

[75] Inventor: Thomas J. Walsh, Hatboro, Pa.

[73] Assignee: General Signal Corporation, Stamford, Conn.

[21] Appl. No.: 471,914

[22] Filed: Mar. 3, 1983

[51] Int. Cl.³ .................. G01K 01/02; G01R 31/02
[52] U.S. Cl. .................. 374/186; 340/870.17; 346/33 TP; 346/34
[58] Field of Search .................. 374/163, 186; 346/34, 346/339 P; 324/51; 340/652

[56] References Cited

U.S. PATENT DOCUMENTS

| | | | |
|---|---|---|---|
| 2,937,369 | 5/1960 | Newbold et al. | 324/111 X |
| 3,755,688 | 8/1973 | Hohler | 340/652 X |
| 3,760,265 | 9/1973 | Hutch | 340/652 X |
| 4,166,243 | 8/1979 | West et al. | 340/652 X |
| 4,307,335 | 12/1981 | Paulson | 324/73 R |

Primary Examiner—Daniel M. Yasich
Attorney, Agent, or Firm—William G. Miller, Jr.; Harold Huberfeld

[57] ABSTRACT

A thermocouple open-circuit detector is made insensitive to noise pick-up in the thermocouple by increasing the bias on the detecting amplifier beyond the point where it would be affected by the noise and providing a means for reducing that bias during the period when the pulses that test the thermocouple are present. The test pulse will then trigger the detecting amplifier on when the thermocouple is open.

1 Claim, 1 Drawing Figure

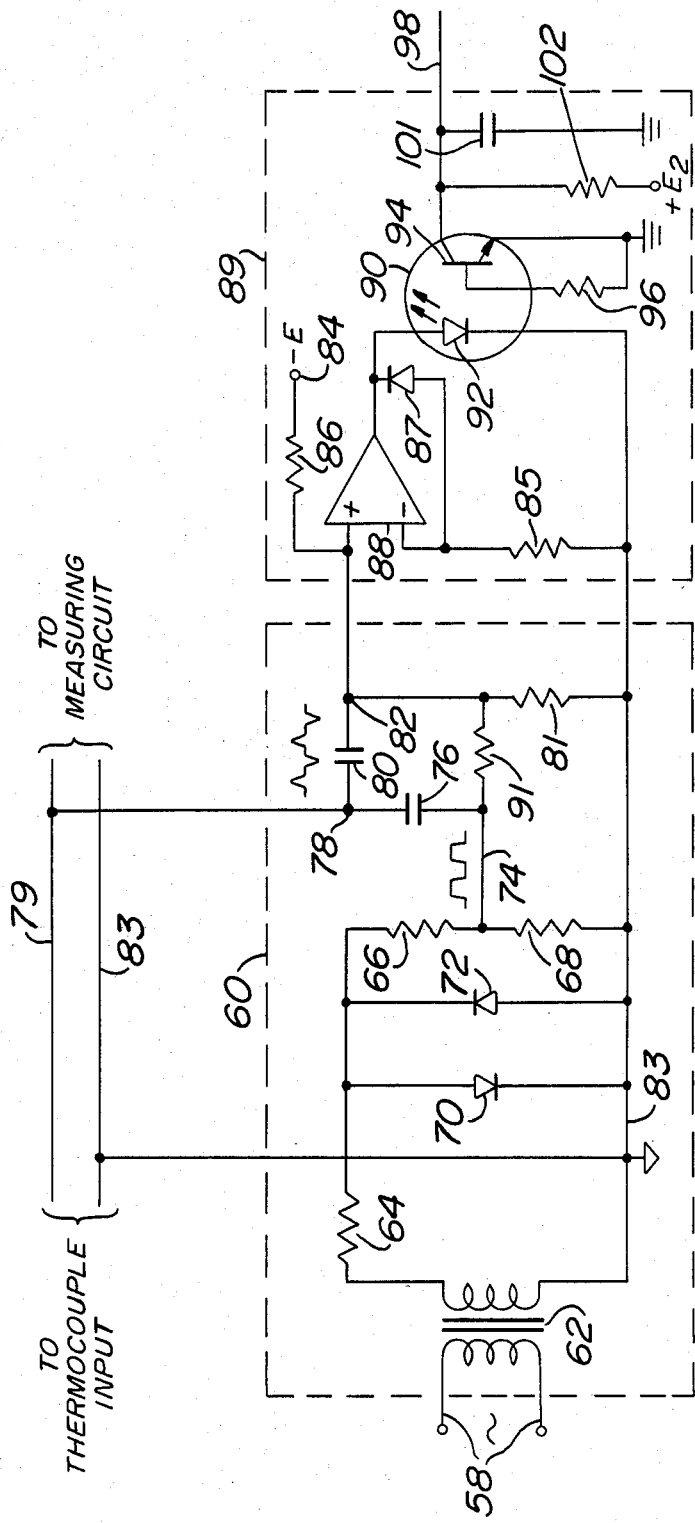

THERMOCOUPLE OPEN CIRCUIT DETECTOR

BACKGROUND OF THE INVENTION

This invention relates to the detection of an open circuit condition in input circuits, particularly in thermocouple inputs to temperature measuring circuits. One useful example of such a circuit is that disclosed in U.S. Pat. No. 4,115,785, issued Sept. 19, 1978, to the present inventor and several of his coworkers. In the use of the circuit of the above mentioned patent, it was found that the presence of noise signals in the thermocouple input circuits occasionally caused false indications of an open circuit condition. These false indications apparently were caused by noise signals overcoming the slight negative bias on amplifier 88, supplied by the d.c. supply -E at terminal 84 to make diode 92 conductive and thus provide the open circuit indication.

It is the object of this invention to provide an open circuit detector which will not be subject to false indications of an open circuit condition as a result of noise in the thermocouple input circuit.

SUMMARY OF THE INVENTION

In carrying out the present invention there is provided a pulse generator with a first capacitor connecting its output to the input circuit being tested, and a second capacitor connecting the circuit being tested to a detector amplifier circuit. A bias is applied to the amplifier with a magnitude sufficient to maintain a zero output from the amplifier even when noise signals are present in the input, as long as no open circuit condition exists. The bias must not be sufficient to prevent the amplifier from being tiggered by a pulse from the pulse generator, by way of the first and second capacitors, when an open circuit condition does occur in the input.

BRIEF DESCRIPTION OF THE DRAWING

The sole FIGURE is a circuit diagram showing a preferred embodiment of the invention.

DESCRIPTION OF THE PREFERRED EMBODIMENT

The disclosure of U.S. Pat. No. 4,115,785 is hereby incorporated by reference into this description of the preferred embodiment of the subject invention. Reference numerals in the FIGURE of this application refer to the same elements referred to in FIG. 1 of the referenced patent.

In the figure there is shown a pulse generator 60 which is supplied from an a.c. source derived from line 58. In the figure, the power supply or power source includes the transformer 62 and the source-connecting resistor 64 which connects across the voltage divider output consisting of resistors 66 and 68. The transformer 62 and the resistor 64 are also connected across a pair of oppositely poled diodes 70 and 72 which form a clipping circuit so as to provide, on line 74, a square wave of limited amplitude.

The output of the clipping circuit appearing on line 74 is connected by way of capacitor 76 to junction 78, which is in turn connected to one side 79 of the thermocouple input. The pulse source 60 is also connected to circuit common 83 as are the thermocouple inputs so that the pulse source 60 is effectively connected across the inputs to the measuring circuit. When the thermocouple inputs between lines 79 and 83 are a complete circuit or are not open circuited, they present a low impedance between lines 79 and 83 so as to effectively ground the terminal 78, preventing any pulse from being supplied by way of capacitor 80 to tap point 82 and the input of detecting circuit 89. Thus, detecting circuit 89 provides at its output line 98 a zero signal indicative of the fact that the thermocouple inputs are not open circuited.

By virtue of the negative potential supplied at terminal 84, and the operation of the voltage dividing circuits provided by resistor 86 and resistors 81, 91, 66, and 68, there is maintained at tap point 82 a negative potential or negative bias which is sufficient when there is no open circuit condition at the thermocouple input so that any noise signals picked up by the thermocouple input will not be sufficient to trigger the amplifier 88 to produce an output therefrom.

When the thermocouple inputs are open circuited, so as to present a high impedance between leads 79 and 83, the pulses supplied on line 74 will be conducted not only through capacitor 76 but also in a clipped form through capacitor 80 to tap point 82. These pulses will overcome the negative bias supplied by the potential established at terminal 84, thus triggering the amplifier 88 to produce an output through diode 92. That output will in turn produce an output on line 98 to provide an indication of an open circuited condition as set forth in the referenced U.S. Pat. No. 4,115,785.

The above mentioned output will occur in spite of the large bias applied to the input of amplifier 88 because of the incorporation of the resistor 91 which couples the pulse from line 74 through resistor 81, thus reducing the negative bias during the positive excursions. Thus, there is provided by the incorporation of resistor 91 in shunt to capacitors 76 and 80 a means for making the circuit of the figure immune to being triggered by noise signals on the thermocouple input during the interval between the pulses on line 74. That interval will be the one during which the thermocouple is most susceptible to noise signals on the input circuit. Although it is not evident from the figure, that part of the pulse period when the pulse is not present is considerably longer than during that part of the period when the pulse is present so that a considerable measure of protection is provided by the circuit.

Referring to the detection circuit 89, it will be evident that a current flow through diode 92 in optical isolator 90 will cause the emission of light which is detected by transistor 94 so as to make transistor 94 conductive and provide an output on line 98. The output of the detecting circuit 89 is supplied across resistor 102 as a result of current flow from a positive potential $+E2$ which is connected through resistor 102 to transistor 94 so that whenever the optical isolator 90 is energized, the potential at the output of circuit 89 on line 98 goes from the value $+E$ to ground potential. As shown in the figure, the output on line 98 is connected to ground through a noise suppressing capacitor 101.

The amplifier 88 is shown with its inverting input connected by way of resistor 85 to the curcuit common 83. The inverting input is also connected by way of diode 87 to conduct current to the output terminal of amplifier 88. The combination of the diode 87 and the resistor 85 is effective to limit the negative voltage of amplifier 88 so it is not in excess of that current which can be tolerated by the optical isolator 90. For example, this value may be something on the order of 0.6 volts.

What is claimed is:

1. In an apparatus for detecting an open circuit condition in at least one thermocouple circuit selectively connected to a measuring input circuit, the improvement comprising:
- a pulse generator for generating pulses;
- a first capacitor connecting said generator to said thermocouple circuit at a junction so that said pulses are conducted through said thermocouple circuit when it is a complete circuit;
- an amplifier;
- a second capacitor connecting said junction to the input of said amplifier;
- a voltage divider means connected at its tap to the input of said amplifier so as to produce a bias of polarity and magnitude to maintain the amplifier output cut off when noise signals appear in the thermocouple circuit and when said at least one thermocouple in the thermocouple circuit is a complete circuit; and
- resistance means for connecting the pulses to said amplifier input in shunt to said first and second capacitors so that when said thermocouple is open-circuited said bias is overcome by the signal supplied through said resistance means and said pulses are conducted to the input of said amplifier to trigger it and produce an output therefrom to provide an indication of the open-circuited condition.

* * * * *